(12) United States Patent
Iwabuchi et al.

(10) Patent No.: US 7,808,457 B2
(45) Date of Patent: Oct. 5, 2010

(54) LIGHT EMITTING DEVICE AND ELECTRONIC APPLIANCE

(75) Inventors: Tomoyuki Iwabuchi, Kanagawa (JP); Yu Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 762 days.

(21) Appl. No.: 11/672,074

(22) Filed: Feb. 7, 2007

(65) Prior Publication Data

US 2007/0126670 A1 Jun. 7, 2007

Related U.S. Application Data

(63) Continuation of application No. 10/743,342, filed on Dec. 23, 2003, now Pat. No. 7,176,858.

(30) Foreign Application Priority Data

Dec. 26, 2002 (JP) .............................. 2002-377139

(51) Int. Cl.
*G09G 3/30* (2006.01)
(52) U.S. Cl. .................... 345/76; 345/77; 315/169.3
(58) Field of Classification Search ............. 345/76–95, 345/204–215, 690–699; 315/169.1–169.4
See application file for complete search history.

(56) References Cited

U.S. PATENT DOCUMENTS

| 6,304,309 | B1 | 10/2001 | Yamanaka |
| 6,466,292 | B1 | 10/2002 | Kim |
| 6,512,504 | B1 | 1/2003 | Yamauchi |
| 6,580,488 | B2 | 6/2003 | Kim |
| 6,583,770 | B1 | 6/2003 | Antila et al. |
| 6,747,609 | B2 | 6/2004 | Antila et al. |

(Continued)

FOREIGN PATENT DOCUMENTS

CN 1366290 8/2002

(Continued)

OTHER PUBLICATIONS

Office Action (Application No. 200380107583.8; PCTCN6845) dated February 2, 2007, 13 total pages.

(Continued)

*Primary Examiner*—Vijay Shankar
(74) *Attorney, Agent, or Firm*—Fish & Richardson P.C.

(57) ABSTRACT

It is an object of the present invention to provide a light emitting device which can be made into a module with smaller volume. By using a light emitting element represented by an EL element and the like as a pixel portion, two pixel portions are formed at different portions over the light emitting device. A first pixel portion comprises a plurality of pixels arranged in matrix. In the periphery of the first pixel portion, a first source line driving circuit and a first gate line driving circuit for transmitting signals to the first pixel portion are formed. A second pixel portion is formed of passive pixels, and segregated from a TFT group which constitutes the first pixel portion, the first source line driving circuit, and the first gate line driving circuit in the direction from the back surface of the substrate to the top surface of the substrate by interposing an interlayer film therebetween.

18 Claims, 6 Drawing Sheets

U.S. PATENT DOCUMENTS

| | | | |
|---|---|---|---|
| 6,888,318 | B2 | 5/2005 | Childs |
| 6,909,240 | B2 | 6/2005 | Osame |
| 7,019,714 | B2 | 3/2006 | Uchida et al. |
| 7,176,858 | B2 * | 2/2007 | Iwabuchi et al. .............. 345/76 |
| 7,176,912 | B2 | 2/2007 | Kota et al. |
| 7,420,551 | B2 | 9/2008 | Kota et al. |
| 2001/0011868 | A1 | 8/2001 | Fukunaga et al. |
| 2001/0055384 | A1 | 12/2001 | Yamazaki |
| 2002/0037754 | A1 | 3/2002 | Hama |
| 2002/0044782 | A1 | 4/2002 | Kota |
| 2002/0191135 | A1 | 12/2002 | Kim |
| 2004/0245529 | A1 | 12/2004 | Yamazaki |
| 2004/0245918 | A1 | 12/2004 | Lee |
| 2004/0251823 | A1 | 12/2004 | Park |
| 2005/0062407 | A1 | 3/2005 | Suh |

FOREIGN PATENT DOCUMENTS

| | | |
|---|---|---|
| EP | 0 881 617 | 12/1998 |
| EP | 1 227 390 | 7/2002 |
| JP | 01-253791 | 10/1989 |
| JP | 02-134696 | 5/1990 |
| JP | 05-298257 | 11/1993 |
| JP | 08-152619 | 6/1996 |
| JP | 10-187052 A | 7/1998 |
| JP | 10-255976 | 9/1998 |
| JP | 10-268250 | 10/1998 |
| JP | 11-007259 A | 1/1999 |
| JP | 2001-051251 | 2/2001 |
| JP | 2001-086205 | 3/2001 |
| JP | 2001-155856 | 6/2001 |
| JP | 2001-274880 | 10/2001 |
| JP | 2001-285445 | 10/2001 |
| JP | 2001-297885 | 10/2001 |
| JP | 2001-305525 | 10/2001 |
| JP | 2001-312228 | 11/2001 |
| JP | 2001-332392 | 11/2001 |
| JP | 2001-345184 | 12/2001 |
| JP | 2001-356714 | 12/2001 |
| JP | 2002-006787 | 1/2002 |
| JP | 2002-014336 | 1/2002 |
| JP | 2002-123208 A | 4/2002 |
| JP | 2002-148604 | 5/2002 |
| JP | 2002-158757 | 5/2002 |
| JP | 2002-343564 | 11/2002 |
| JP | 3408154 | 5/2003 |
| JP | 2003-317959 | 11/2003 |
| JP | 2003-345271 | 12/2003 |
| WO | WO 99/18590 | 4/1999 |

OTHER PUBLICATIONS

Patent Office of the People's Republic of China, Office Action (in related Application No. 200380107583.8; PCTCN6845) dated Aug. 24, 2007 (14 pages).

Exhibition of Active Matrix Type Organic EL Display at "13$^{th}$ Flat Panel Display Manufacturing Technology Expo & Conference" by ELDis Group (*in Japanese with full translation*); Jul. 2, 2003.

Documents distributed in the "13$^{th}$ Flat Panel Display Manufacturing Technology Expo & Conference" by ELDis Group; (5 pages); Jul. 3, 2003.

International Preliminary Examination Report (Application No. PCT/JP03/15705), 6 pages, dated Mar. 30, 2004 (Partial Translation).

International Preliminary Report (PCT Application No. PCT/JP2003/016030 filed Dec. 15, 2003); 4 pages—in English dated Jun. 9, 2005.

International Search Report (Application No. PCT/JP03/15705), 3 pages, dated Mar. 2, 2004 (in Japanese).

International Search Report (Application No. PCT/JP03/16030) dated Feb. 24, 2004.

"Mass Production of Organic EL Devices"; *Shimotsuke Newspaper* (*in Japanese with full translation*); Jul. 3, 2003.

SID Digest '03 : SID International Symposium Digest of Technical Papers QCIF Full Color Transparent Amoled Display, pp. 104-107, Lee K, Ryu S., Kwonj., Kim S., Chung H., Publication Date: May 1, 2003.

"Two-way display developed"; *The Japan Times*; (1 page); Jul. 3, 2003.

Office Action (Korean Patent Application No. 2005-7011842) dated Mar. 31, 2010, with English translation.

Office Action, Taiwanese Application No. 92136739, mailed Jul. 6, 2010, 11 pages with English translation.

* cited by examiner

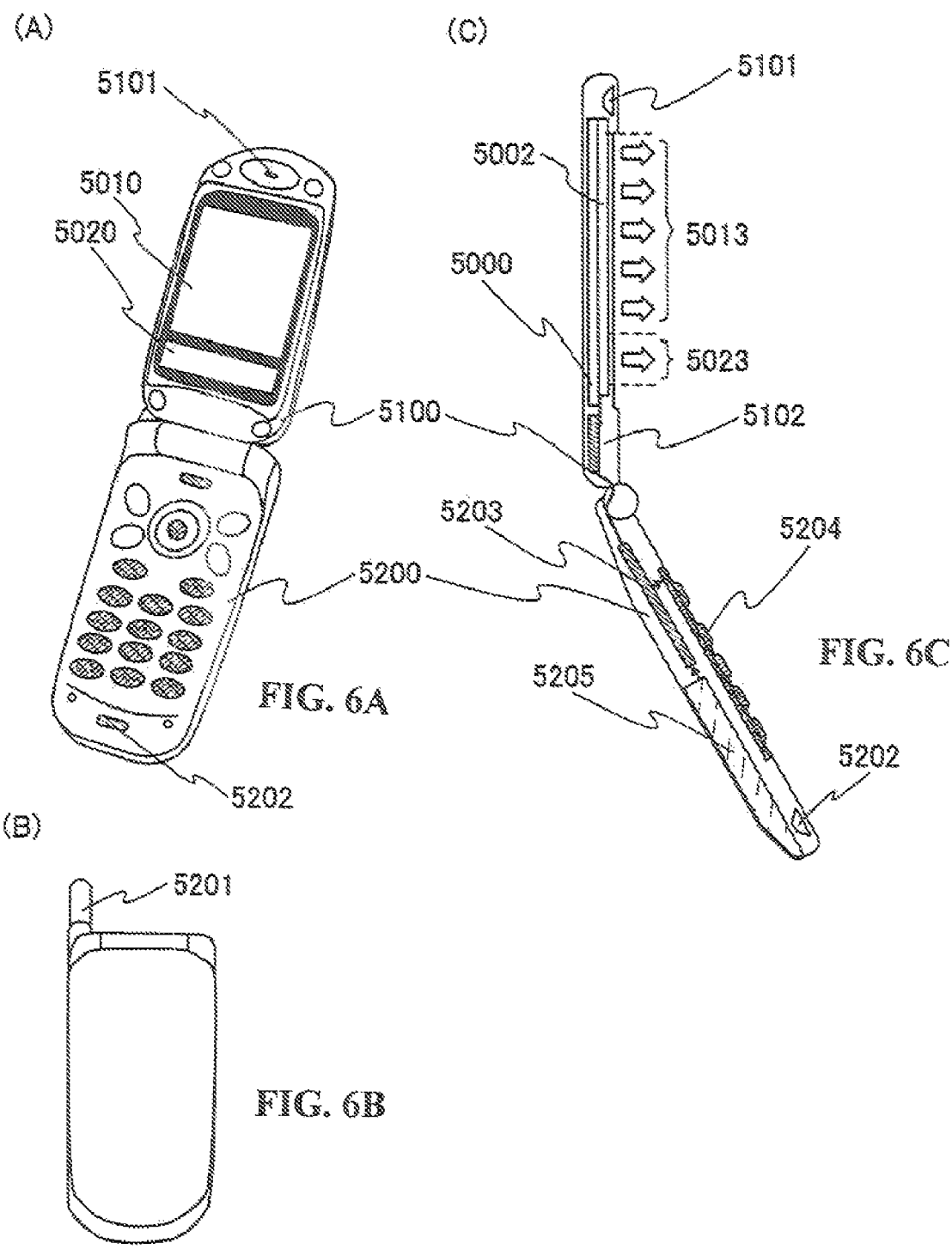

LIGHT EMITTING DEVICE AND ELECTRONIC APPLIANCE

TECHNICAL FIELD

The present invention relates to a light emitting device having a light emitting element, more particularly, to a light emitting device that can be used for a portable information terminal such as a cellular phone, and a personal digital assistance (PDA).

BACKGROUND ART

In recent years, a light emitting device using a light emitting element represented by an electroluminescence (EL) element and the like has been researched and developed as a substitute for a liquid crystal display (LCD) having pixels which employ liquid crystal elements. The light emitting device has advantages of high image quality, wide viewing angle, and thin shape with lightweight due to needlessness of a backlight since the light emitting device is of the self-emission type, etc. By making use of these advantages, the light emitting device is expected to be widely used for display screens of cellular phones or display devices.

In addition, a portable information terminal that provide high added value has been required as a result of diversification of the intended use. Recently, a portable information terminal having a sub screen formed on the backside of a normal main screen has been provided (for instance, see following Patent Document 1 and Patent Document 2).

[Patent Document 1]
Japanese published unexamined No. 2001-285445
[Patent Document 2]
Japanese published unexamined No. 2001-86205

DISCLOSURE OF THE INVENTION

Problems to be Solved by the Invention

With respect to the portable information terminal provided with the sub screen in addition to the primary main screen, it is necessary to take into consideration not only a volume occupied by a module including a backlight and the like but also a volume occupied by a substrate and the like on which a control IC for driving the module etc. is mounted. In Particular, portable information terminals in the marketplace are significantly lightened, thinned, shortened and miniaturized, which results in the trade-off between high added value and miniaturization.

The present invention is made in view of the foregoing problems, and an object thereof is to provide a light emitting device which can be made into a module with smaller volume.

Means for Solving the Problems

In order to solve the above-mentioned problems, the present invention takes the following measures.

Light emitting elements represented by EL elements and the like are used for pixel portions. Two pixel portions are formed at different positions on a light emitting device, respectively. A first pixel portion comprises an active matrix structure in which pixels are arranged in matrix and each pixel is controlled so as to be turned on or turned off by a switching element. The first pixel portion is driven by an active matrix system. In the periphery of the first pixel portion, a first driving portion for operating the first pixel portion such as a first source line driving circuit and a first gate line driving circuit, which transmit signals to the first pixel portion, is provided. A section in which circuits are formed in the periphery of a substrate or in the periphery of the pixel portions is referred to as a peripheral circuit portion as the first driving portion. The second pixel portion comprises a passive matrix structure in which intersections of stripe-shape upper electrodes and stripe-shape lower electrodes arranged to be opposed to each other are used as pixels, respectively. The second pixel portion is driven by a passive matrix system. The second pixel portion is formed so as to be overlapped with a TFT group constituting the first source line driving circuit or the first gate line driving circuit in a direction from a back surface of the substrate to a top surface the substrate. The second pixel portion and the TFT group of the first source line driving circuit or the first gate line driving circuit are isolated each other by an interlayer film. That is, the second pixel portion is formed over the interlayer film that is formed over the first driving portion such as the TFT group constituting the first source line driving circuit or the first gate line driving circuit. A light emitting element within the second pixel portion has a structure in which light emitted from the light emitting element within the second pixel portion is emitted in the direction from the back surface of the substrate to the top surface of the substrate. Therefore, light emitted from the light emitting element within the second pixel portion is not obscured by a layer with TFTs formed thereon that is formed on the side of the back-side surface of the substrate with respect to the light emitting element within the second pixel portion. Hence, the second pixel portion can be formed by overlapping with the TFT group constituting the first source line driving circuit or the first gate line driving circuit in the direction along the top surface of the substrate, which results in the space saving.

Further, the second pixel portion may be formed by overlapping with the TFT group that constitutes a peripheral circuit having functions other than the first source line driving circuit or the first gate line driving circuit, for example, a peripheral circuit comprising a function such as an image processing circuit, a central processing unit (CPU), and a memory, in the direction from the back surface of the substrate to the top surface of the substrate.

In addition, the light emitting device may take a structure in which the light emitting direction of the first pixel portion is opposite to the light emitting direction of the second pixel portion.

Further, display screens may be selected depending on the intended purpose.

In order to select the display screens, for instance, a following structure may be employed. A switching element is formed in any one of electric current paths for supplying electric current into the light emitting element. When the first pixel portion emits light, electric current may not be supplied to the second pixel portion. Meanwhile, when the second pixel portion emits light, electric current may not be supplied to the first pixel portion.

In case of using the structure as mentioned above, with respect to the light emitting device including the first driving portion for operating the first pixel portion, the second driving portion for driving the second pixel portion, and wiring lines for supplying signals and a voltage to the first and second driving portions, it may take a structure in which the wiring lines for supplying the signals and voltage to the first driving portion and the second driving portion are partly or entirely shared, and means for operating any one of the first and second pixel portions may be provided so as to switch the operations in the outside.

A light emitting device according to the present invention is characterized by comprising:

a first pixel portion including a plurality of first pixels arranged in matrix on a surface of a substrate; and a second pixel portion comprising a plurality of second pixels arranged at a position different from the first pixel portion over the surface of the substrate.

wherein the first pixel portion comprises the plurality of first pixels having a first light emitting element that emits light to the side of the surface of the substrate, and wherein the second pixel portion is formed over an interlayer film formed over a peripheral circuit portion, and the second pixel portion includes the plurality of second pixels having a second light emitting element that emits light to the side of the surface of the substrate.

A light emitting device according to the present invention is characterized by comprising:

a first pixel portion including a plurality of first pixels arranged in matrix over a surface of a substrate; and a second pixel portion including a plurality of second pixels arranged at a position different from the first pixel portion over the surface of the substrate, wherein the first pixel portion includes the plurality of first pixels having a first light emitting element which emits light in a direction opposite to the surface of the substrate, and wherein the second pixel portion is formed over an interlayer film formed over a peripheral circuit portion, and includes the plurality of second pixels having a second light emitting element which emits light to the side of the surface of the substrate.

The light emitting device according to the present invention is characterized by comprising:

a first driving portion for operating the first pixel portion;

a second driving portion for operating the second pixel portion;

wiring lines for supplying signals and a voltage to the first and second driving portions, respectively, and the wiring lines are partly or entirely shared; and means for operating any one of the first and second pixel portions.

The light emitting device according to the present invention is characterized in that the peripheral circuit portion is the first driving portion for operating the first pixel portion.

The light emitting device according to the present invention is characterized in that each of the plurality of first pixels comprises switching elements, respectively, and the first pixel portion is driven by an active matrix system.

The light emitting device according to the present invention is characterized in that the second pixel portion is driven by a passive matrix system.

the light emitting device according to the present invention is characterized in that the light emitting device is incorporated into an electric equipment.

Note that thin film transistors (TFTs) are used as the switching elements and driving elements throughout the present specification. However, the present invention is not particularly limited thereto. For instance, a MOS transistor, an organic transistor, a molecular transistor and the like can be used as the switching elements or the driving elements and each of them can be used in the same manner as the thin film transistors.

According to the aforementioned constitution, the present invention can provide a thin light emitting device with smaller volume. Furthermore, the number of input signals can be reduced by switching or sharing the signals and voltage which is required for driving the pixel portions in accordance with the display screens. The preset invention can be applied to other light emitting devices and the like in addition to the light emitting device using the electroluminescence element as the light emitting element.

BRIEF DESCRIPTION OF THE DRAWINGS

FIGS. 6(A) to 6(C) show examples of structures in case of applying a panel substrate, which is a light emitting device according to the present invention, to a folding-type cellular phone [Embodiment 1].

BEST MODE FOR CARRYING OUT THE INVENTION

Embodiment modes according to the present invention will hereinafter be described.

Embodiment Mode 1

One embodiment mode according to the present invention will be described with reference to FIG. 1.

Figure 1A:
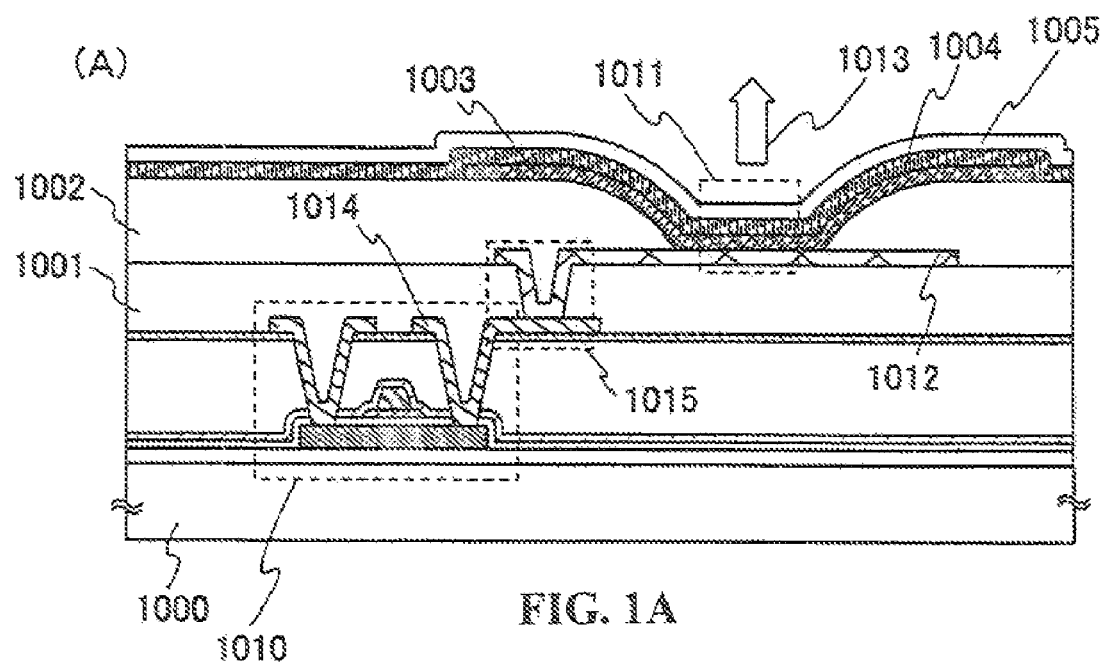
FIGS. 1(A) and 1(B) show cross sectional views showing examples of structures of pixel portions of a light emitting device [Embodiment Mode 1]
Figure 1B:
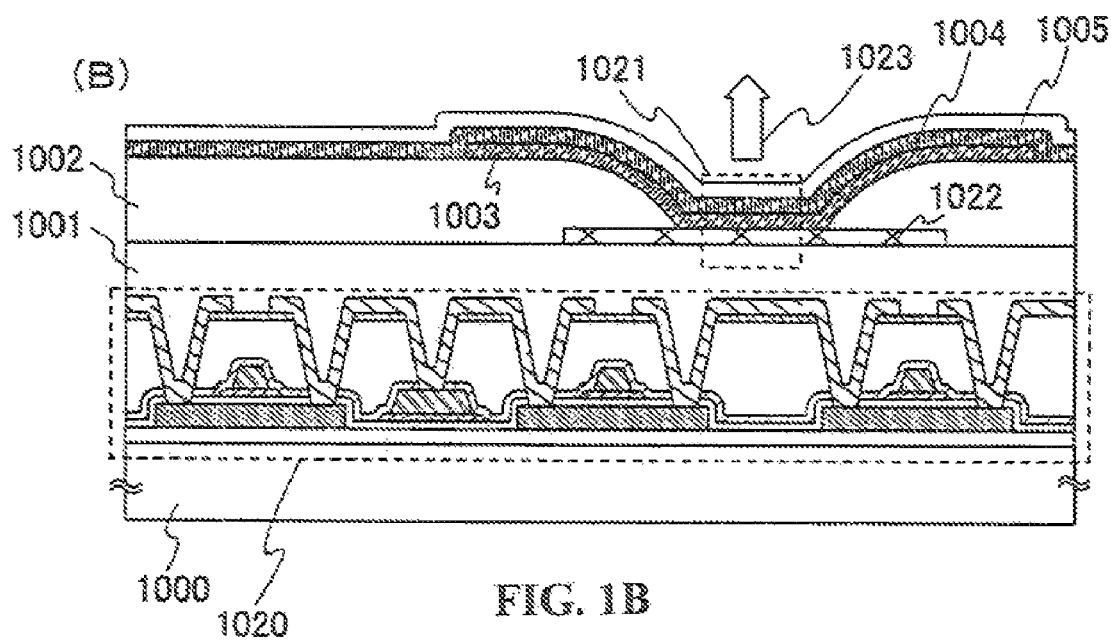
Figure 4:
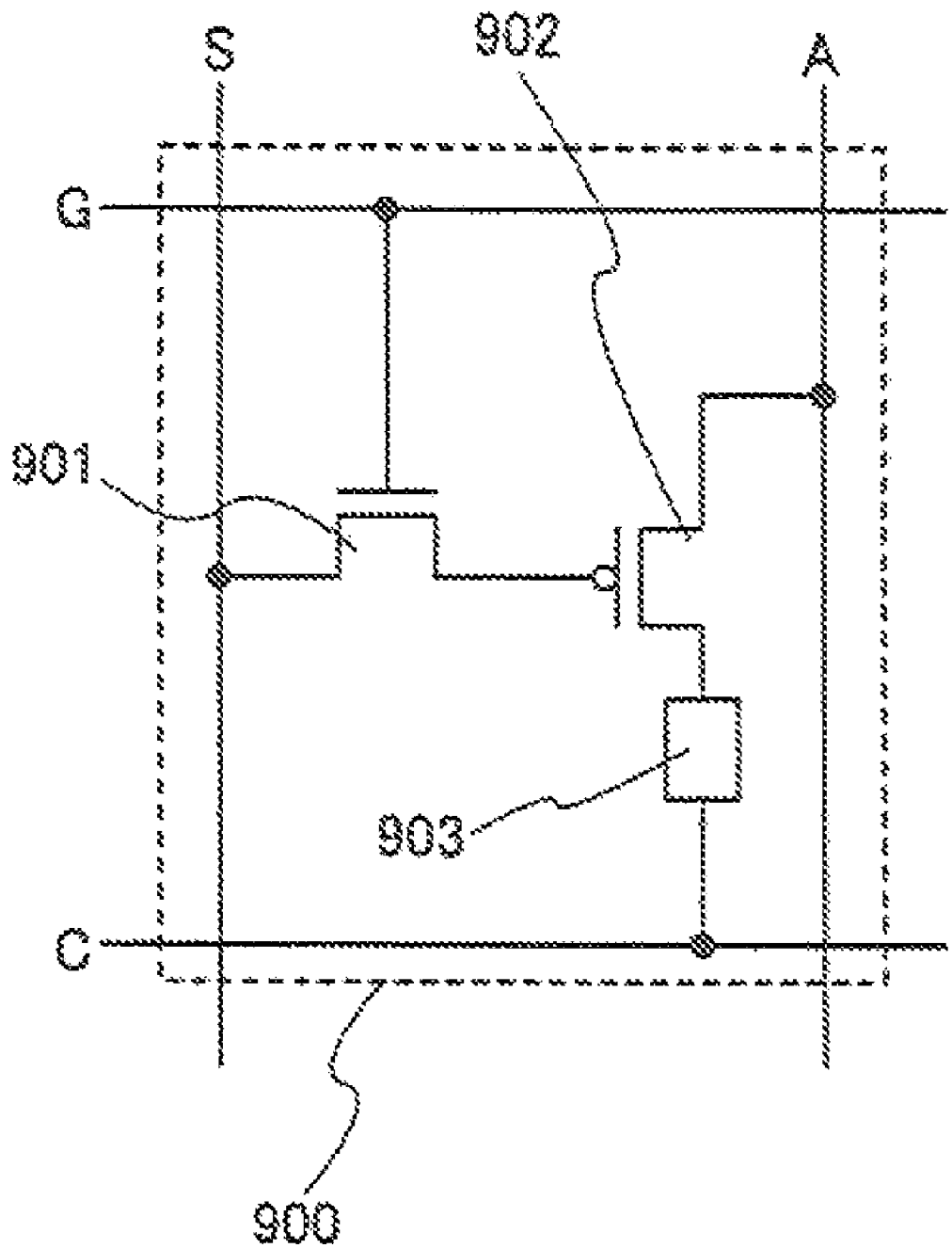
FIG. 4 is a circuit diagram showing one example of pixel portions of a light emitting device.

FIG. 1(A) is an example showing a cross sectional view of one pixel in a first pixel portion. The first pixel portion has a plurality of first pixels as depicted in FIG. 1(A) on a surface of a substrate, in which the plurality of first pixels are arranged in matrix. FIG. 1(B) is an example showing a cross sectional view of one pixel in a second pixel portion. The second pixel portion has a plurality of second pixels as depicted in FIG. 1(B) at a position different from that of the first pixel portion over the surface of the substrate. Note that the same portions in FIG. 1(A) and 1(B) are denoted by the same reference numerals. Further, FIG. 4 shows an example of a circuit diagram of one pixel in the first pixel portion. In FIG. 4, reference numeral 900 denotes a pixel, reference numeral 901 denotes a switching TFT, reference numeral 902 denotes a driving TFT, and reference numeral 903 denotes a light emitting element.

In FIG. 1(A), a region surrounded by a dotted frame 1010 designates a driving TFT. The driving TFT supplies electric current to a light emitting element 1011 directly or via other circuit elements.

The light emitting element 1011 is formed by laminating a pixel electrode 1012, an electroluminescent layer 1003, and an counter electrode 1004. The light emitting element 1011 emits light in a direction to the side of the surface of a substrate 1000. That is, the light emitting element 1011 emits light in a direction denoted by an arrow of a light emitting direction 1013. At this time, the pixel electrode 1012 is formed of a reflective film such as aluminum, and has a function of reflecting light that is emitted in the direction opposite to the light emitting direction 1013. Accordingly, the light emitting element 1011 has a structure in which light is selectively emitted in the direction denoted by the light emitting direction 1013. Note that the pixel electrode 1012 may have a structure in which a transparent conductive film is laminated on the reflective film. Further, the counter electrode 1004 that is laminated on the electroluminescent layer 1003 in the direction denoted by the light emitting direction 1013 is formed of the transparent conductive film, or aluminum which is formed to have a thickness enough thin to transmit light, and the like. A protective film 1005 is formed of a light transmissive film such as a carbon nitride film.

A second interlayer film 1001 is interposed between an electrode 1014 of the driving TFT 1010 and the pixel electrode 1012. A contact hole 1015 is formed so as to electrically connect the electrode 1014 of the driving TFT and the pixel electrode 1012. An insulating film 1002, which is referred to as a bank or a partition wall, is formed between the adjacent first pixels. The insulating film 1002 is formed so as to cover the edge portion of the pixel electrode 1012. If the insulating film 1002 is not provided, edge leakage is generated between the edge portions of the pixel electrode 1012 and the counter electrode 1004. The insulating film 1002 has a function of preventing the edge leakage.

In FIG. 1(B), a region surrounded by a dotted frame 1020 designates a TFT group that constitutes peripheral circuits of a first source line driving circuit, or a first gate line driving circuit for supplying signals which are necessary for driving the first pixel portion. The second pixel portion is formed over the TFT group that constitutes the peripheral circuits.

The second pixel portion includes a light emitting element 1021. The light emitting element 1021 is formed by laminating a pixel electrode 1022, the electroluminescent layer 1003, and the counter electrode 1004. The light emitting element 1021 emits light in a direction to the side of the surface of a substrate 1000, i.e., in a direction illustrated by an arrow of a light emitting direction 1023. At this time, the pixel electrode 1022 is formed of the reflective film such as aluminum. The pixel electrode 1022 has a function of reflecting light that is emitted from the light emitting element 1021 in the direction opposite to the light emitting direction 1023. As a result, the light emitting element 1021 has a structure in which light is selectively emitted in a direction denoted by the light emitting direction 1023. Note that the pixel electrode 1022 may take a structure in which a transparent conductive film is laminated over the reflective film. Further, the counter electrode 1004 that is laminated over the electroluminescent layer 1003 in the direction denoted by the light emitting direction 1023 is formed of a transparent conductive film, aluminum having a thickness enough thin to transmit light, and the like. The protective film 1005 is formed of a light transmissive film such as a carbon nitride film.

The second interlayer film 1001 is interposed between the TFT group 1020 and the pixel electrode 1022 such that the TFT group 1020 is not electrically connected to the pixel electrode 1022. The insulating film 1002, which is referred to as a bank or a partition wall, is interposed between the neighboring second pixels. The insulating film 1002 is formed so as to cover the edge portions of the pixel electrode 1022. If the insulating film 1002 is not interposed therebetween, edge leakage is generated between the edge portions of the pixel electrode 1022 and the counter electrode 1004. The insulating film 1002 has a function of preventing the edge leakage.

The electroluminescent layer 1003 in FIG. 1(A) is identical with the electroluminescent layer 1003 in FIG. 1(B). However, these electroluminescent layers may be formed of different materials. Further, these electroluminescent layers 1003 may be formed of different materials by pixels.

The counter electrode 1004 in FIG. 1(A) is identical with the counter electrode 1004 in FIG. 1(B). However, these counter electrodes may be formed of different materials. Further, these counter electrodes may not be electrically connected.

The protective film 1005 in FIG. 1(A) is identical with the protective film 1005 in FIG. 1(B). However, these protective films may be formed of different materials.

In addition, the electroluminescent layer 1003 may be formed of any material among low-molecular-weight materials, high-molecular-weight materials, and intermediate-molecular-weight materials.

Noted that, actually, after the device is completed up to the state of FIG. 1, it is preferred to package (or encapsulate) the device with a protective film (such as a laminate film, and an ultraviolet light curable resin film) or a light-transmitting cover material, having high air-tightness permitting the gas to escape little so that the device will not be exposed to the outside air.

Further, p-channel TFTs or n-channel TFTs etc. which are manufactured by a known method are used for the driving TFT 1010 and the TFT group 1020.

Embodiment Mode 2

One embodiment mode according to the present invention will be described with reference to FIG. 2.

Figure 2A:
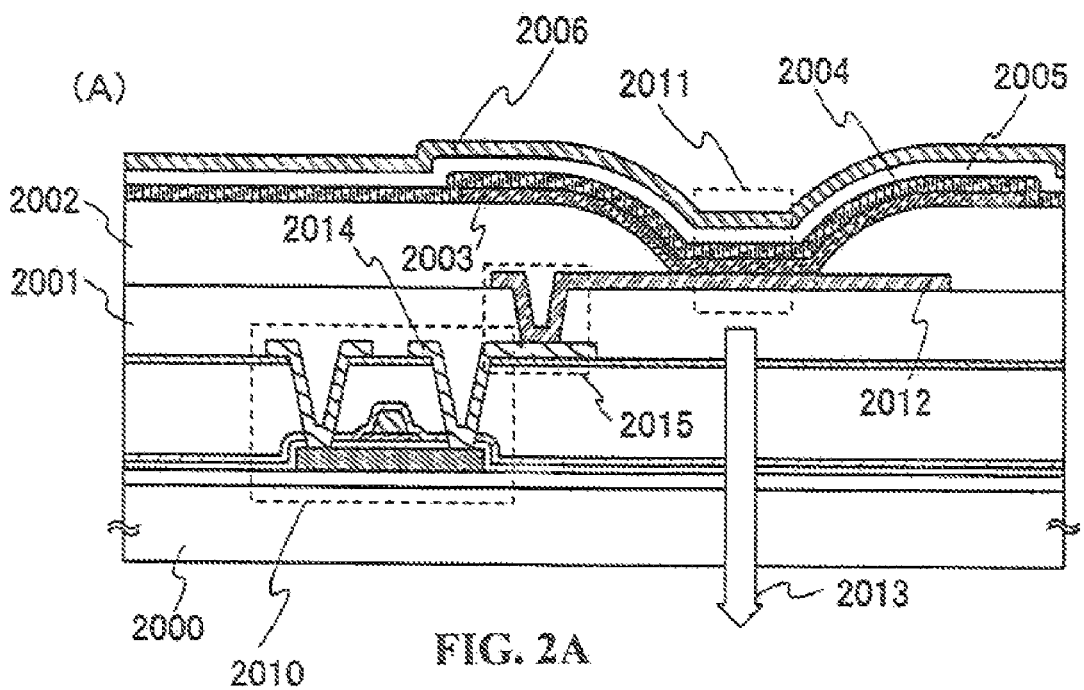
FIGS. 2(A) and 2(B) show cross sectional views showing examples of structures of pixel portions of a light emitting device [Embodiment Mode 2]
Figure 2B:
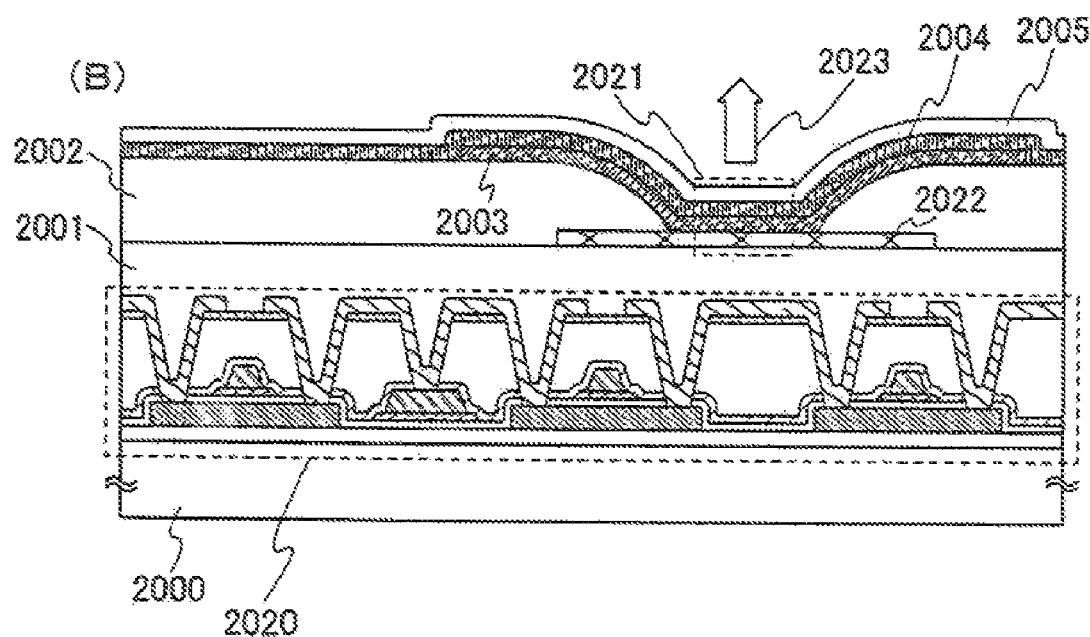

FIG. 2(A) is an example showing a cross sectional view of one pixel in the first pixel portion. The first pixel portion has a plurality of first pixels as depicted in FIG. 2(A) over a surface of a substrate, in which the first pixels are arranged in matrix. FIG. 2(B) is an example showing a cross sectional view of one pixel in a second pixel portion. The second pixel portion has a plurality of second pixels as depicted in FIG. 2(B) at a position different from the first pixel portion over the surface of the substrate. Note that the same portions in FIGS. 2(A) and 2(B) are denoted by the same reference numerals. Further, FIG. 4 shows an example of a circuit diagram of one pixel in the first pixel portion. In FIG. 4, reference numeral 900 denotes a pixel, reference numeral 901 denotes a switching TFT, reference numeral 902 denotes a driving TFT, and reference numeral 903 denotes a light emitting element.

In FIG. 2(A), a region surrounded by a dotted frame 2010 denotes a driving TFT. The driving TFT supplies electric current to a light emitting element 2011 directly or via other circuit elements.

The light emitting element 2011 is formed by laminating a pixel electrode 2012, an electroluminescent layer 2003, and a counter electrode 2004. The light emitting element 2011 emits light in a direction opposite to a surface of a substrate 2000. That is, the light emitting element 2011 emits light in a direction denoted by an arrow which indicates a light emitting direction 2013. The pixel electrode 2012 is formed of a transparent conductive film. Films formed in the direction denoted by the light emitting direction 2013 from the pixel electrode 2012, and the substrate 2000 are formed of light-transmitting materials. A reflective film 2006 is formed over a protective film 2005. The reflective film 2006 has a function of reflecting light emitted form the light emitting element 2011 in the direction opposite to the light emitting direction 2013. Accordingly, the light emitting element 2011 has a structure in which light is selectively emitted in the direction denoted by the light emitting direction 2013.

A second interlayer film 2001 is interposed between an electrode 2014 of the driving TFT 2010 and the pixel electrode 2012. A contact hole 2015 is formed so as to electrically connect the electrode 2014 of the driving TFT 2010 and the pixel electrode 2012. An insulating film 2002, which is referred to as a bank or a partition wall, is interposed between the neighboring first pixels so as to cover the edge portions of the pixel electrode 2012. If the insulating film 2002 is not provided, edge leakage is generated between the edge portions of the pixel electrode 2012 and the counter electrode 2004. The insulating film 2002 has a function of preventing the edge leakage.

In FIG. 2(B), a region surrounded by a dotted frame 2020 is a TFT group that constitutes peripheral circuits such as a first source line driving circuit or the first gate line driving circuit for supplying signals which are necessary for driving the first pixel portion. The second pixel portion is formed over the TFT group that constitutes the peripheral circuits.

The second pixel portion includes a light emitting element 2021. The light emitting element 2021 is formed by laminating a pixel electrode 2022, the electroluminescent layer 2003, and the counter electrode 2004. The light emitting element 2021 emits light to the side of the surface of the substrate 2000, i.e., in a direction illustrated by an arrow of a light emitting direction 2023. At this time, the pixel electrode 2022 is formed of the reflective film such as aluminum, and has a function of reflecting light that is emitted from the light emitting element 2021 in the direction opposite to the light emitting direction 2003. Accordingly, the light emitting element 2021 has a structure in which light is selectively emitted in a direction denoted by the light emitting direction 2023. Note that the pixel electrode 2022 may take a structure in which a transparent conductive film is laminated over the reflective film. Further, the counter electrode 2004 that is laminated over the electroluminescent layer 2003 in the direction denoted by the light emitting direction 2023 is formed of a transparent conductive film, aluminum which is formed to have a thickness enough thin to transmit light, and the like. The protective film 2005 is formed of a light transmissive film such as a carbon nitride film.

the second interlayer film 2001 is interposed between the TFT group 2020 and the pixel electrode 2022 such that the TFT group 2020 is not electrically connected to the pixel electrode 2022. The insulating film 2002, which is referred to as a bank or a partition wall, is interposed between the neighboring second pixels so as to cover the edge portions of the pixel electrode 2022. If the insulating film 2002 is not formed therebetween, edge leakage is generated between the edge portions of the pixel electrode 2022 and the counter electrode 2004. Accordingly, the insulating film 2002 has a function of preventing the edge leakage.

The electroluminescent layer 2003 in FIG. 2(A) is identical with the electroluminescent layer 2003 in FIG. 2(B). However, these electroluminescent layers may be formed of different materials. Further, these electroluminescent layers 2003 may be formed of different materials by pixels.

The counter electrode 2004 in FIG. 2(A) is identical with the counter electrode 2004 in FIG. 2(B). However, these counter electrodes may be formed of different materials. Further, these counter electrodes may not be electrically connected.

The protective film 2005 in FIG. 2(A) is identical with the protective film 2005 in FIG. 2(B). However, these protective films may be formed of different materials.

In addition, the electroluminescent layer 2003 may be formed of any material among low-molecular-weight materials, high-molecular-weight materials, and intermediate-molecular-weight materials.

Noted that, actually, after the device is completed up to the state of FIGS. 2(A) and 2(B), it is preferred to package (or encapsulate) the device with a protective film (such as a laminate film, and an ultraviolet light curable resin film) or a light-transmitting cover material having high air-tightness permitting the gas to escape little so that the device will not be exposed to the outside air.

Further, p-channel TFTs or n-channel TFTs etc. which are manufactured by a known method are used for the driving TFT 2010 and the TFT group 2020.

Embodiment Mode 3

One embodiment mode according to the present invention will be described with reference to FIG. 3.

Figure 3A:
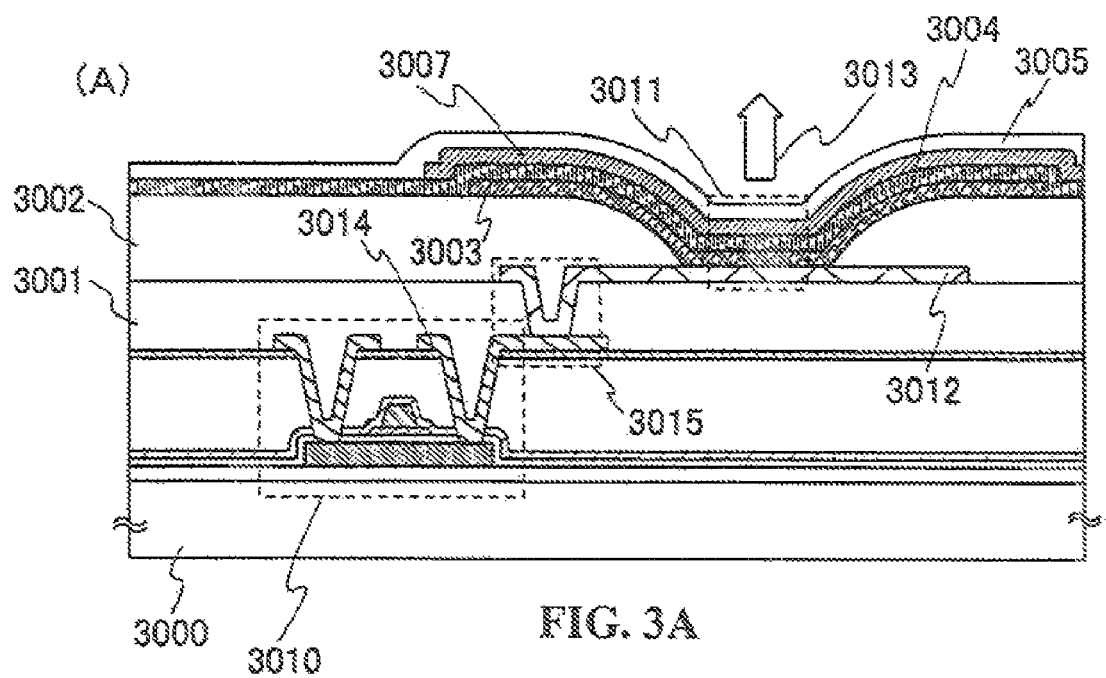
FIGS. 3(A) and 3(B) show cross sectional views showing examples of structures of pixel portions of a light emitting device [Embodiment Mode 3]
Figure 3B:
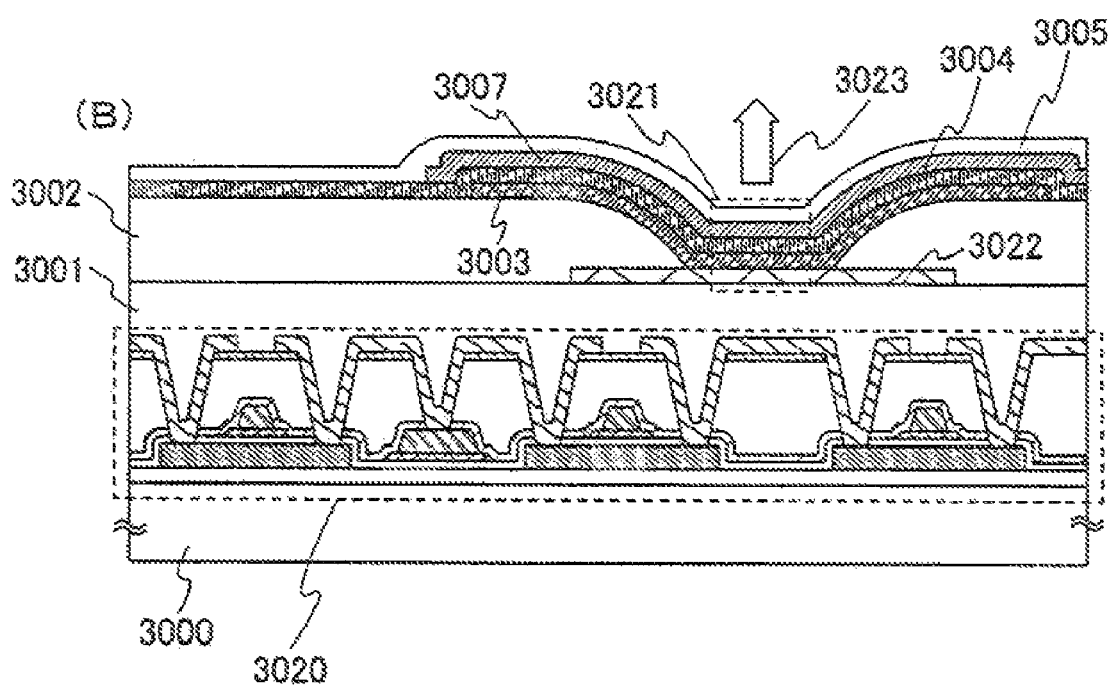

FIG. 3(A) is an example showing a cross sectional view of one pixel in a first pixel portion. The first pixel portion has a plurality of first pixels as depicted in FIG. 3(A) on a surface of a substrate, in which the first pixels are arranged in matrix. FIG. 3(B) is an example showing a cross sectional view of one pixel in a second pixel portion. The second pixel portion has a plurality of second pixels as depicted in FIG. 3(B) at a position different from the first pixel portion over the surface of the substrate. Note that the same portions in FIG. 3(A) and 3(B) are denoted by the same reference numerals. Further, FIG. 4 shows an example of a circuit diagram of one pixel in the first pixel portion. In FIG. 4, reference numeral 900 denotes a pixel, reference numeral 901 denotes a switching TFT, reference numeral 902 denotes a driving TFT, and reference numeral 903 denotes a light emitting element.

In FIG. 3(A), a region surrounded by a dotted frame 3010 designates a driving TFT. The driving TFT supplies electric current to a light emitting element 3011 directly or via other circuit elements.

The light emitting element 3011 is formed by laminating a pixel electrode 3012, an electroluminescent layer 3003, and a counter electrode 3004. The light emitting element 3011 emits light in a direction to the side of the substrate 3000, which is denoted by an arrow which indicates a light emitting direction 3013. At this time, the pixel electrode 3012 is formed of a reflective film such as aluminum, and has a function of reflecting light that is emitted in the direction opposite to the light emitting direction 3013. Accordingly, the light emitting element 3011 has a structure in which light is selectively emitted in the direction denoted by the light emitting direction 3013. Note that the pixel electrode 3012 may take a structure in which a transparent conductive film is laminated over the reflective film. The counter electrode 3004, which is laminated over the electroluminescent layer 3003 in the direction to the side of the surface of the substrate, is formed of the transparent conductive film, or aluminum formed to have a thickness enough thin to transmit light, and the like. A protective film 3005 is formed of a light transmissive film such as a carbon nitride film. A color filter 3007 is formed of a color resist and the like. When color filters 3007 are formed of different materials by pixels, each pixel can emit different color of light.

A second interlayer film 3001 is interposed between an electrode 3014 of the driving TFT 3010 and the pixel electrode 3012. A contact hole 3015 is formed so as to electrically connect the electrode 3014 of the driving TFT 3010 and the pixel electrode 3012. An insulating film 3002, which is referred to as a bank or a partition wall, is interposed between neighboring first pixels. The insulating film 3002 is formed so as to cover the edge portions of the pixel electrode 3012. If the insulating film 3002 is not provided, edge leakage is generated between the edge portions of the pixel electrode 3012 and the counter electrode 3004. Accordingly, the insulating film 3002 has a function of preventing the edge leakage.

In FIG. 3(B), a region surrounded by a dotted frame 3020 designates a TFT group that constitutes peripheral circuits such as a first source line driving circuit, and the first gate line driving circuit for supplying signals which are necessary for driving the first pixel portion. The second pixel portion is formed over the TFT group that constitutes the peripheral circuits.

The second pixel portion includes a light emitting element 3021. The light emitting element 3021 is formed by laminating a pixel electrode 3022, the electroluminescent layer 3003, and the counter electrode 3004. The light emitting element 3021 emits light to the side of the surface of the substrate 3000, i.e., in a direction depicted by an arrow of a light emitting direction 3023. At this time, the pixel electrode 3022 is formed of the reflective film such as aluminum, and has a function of reflecting light that is emitted in the direction opposite to the light emitting direction 3023 from the light emitting element 3021. Accordingly, the light emitting element 3021 has a structure in which light is selectively emitted in the direction denoted by the light emitting direction 3023. Note that the pixel electrode 3022 may take a structure in which a transparent conductive film is laminated over the reflective film. Further, the counter electrode 3004 that is laminated over the electroluminescent layer 3003 in the direction denoted by the light emitting direction 3023 is formed of a transparent conductive film, aluminum formed to a thickness enough thin to transmit light, and the like. The protective film 3005 is formed of a light-transmissive film such as a carbon nitride film. The color filter 3007 is formed of the color resist and the like. When color filters 3007 are formed of different materials by pixels, each pixel can emit different color of light.

The second interlayer film 3001 is interposed between the TFT group 3020 and the pixel electrode 3022 such that the TFT group 3020 is not electrically connected to the pixel electrode 3022. An insulating film 3002, which is referred to as a bank or a partition wall, is formed between neighboring second pixels so as to cover the edge portions of the pixel electrode 3022. If the insulating film 3002 is not formed, edge leakage is generated between the edge portions of the pixel electrode 3022 and the counter electrode 3004. The insulating film 3002 has a function of preventing the edge leakage.

The electroluminescent layer 3003 in FIG. 3(A) is identical with the electroluminescent layer 3003 in FIG. 3(B). However, these electroluminescent layers may be formed of different materials. Further, these electroluminescent layers may be formed of different materials by pixels.

The counter electrode 3004 in FIG. 3(A) is identical with the counter electrode 3004 in FIG. 3(B). However, these counter electrodes may also be formed of different materials. Further, these counter electrodes may not be electrically connected.

The protective film 3005 in FIG. 3(A) is identical with the protective film 3005 in FIG. 3(B). However, these protective films may be formed of different materials.

the color filters 3007 may be formed of different materials for each region.

In addition, the electroluminescent layers 3003 may be formed of any material among low-molecular-weight materials, high-molecular-weight materials, and intermediate-molecular-weight materials.

Noted that, actually, after the device is completed up to the state of FIG. 3, it is preferred to package (or encapsulate) the device with a protective film (such as a laminate film, and an ultraviolet light curable resin film) or a light-transmitting cover material having high air-tightness permitting the gas to escape little so that the device will not be exposed to the outside air.

Further, p-channel TFTs or n-channel TFTs etc., which are manufactured by a known method are used for the driving TFT 3010 or the TFT group 3020.

Embodiments

An embodiment according to the present invention will hereinafter be described.

Embodiment 1

An example of a panel substrate for constituting the light emitting device according to the present invention will be described.

Figure 5A:
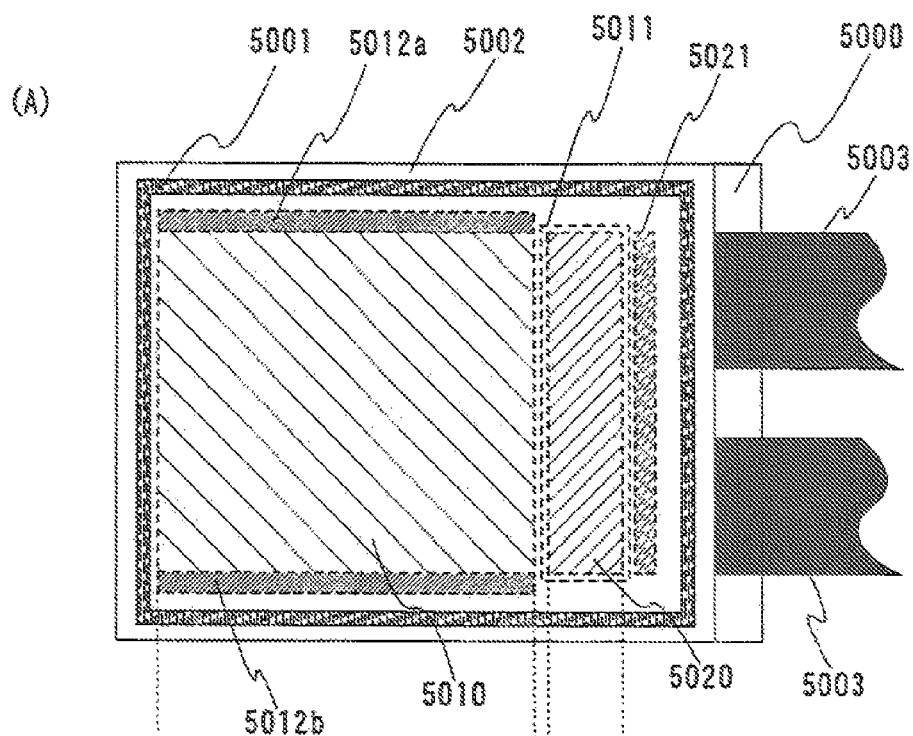
FIGS. 5(A) and 5(B) show diagrams showing examples of structures of a panel substrate which is a light emitting device according to the present invention [Embodiment 1]
Figure 5B:
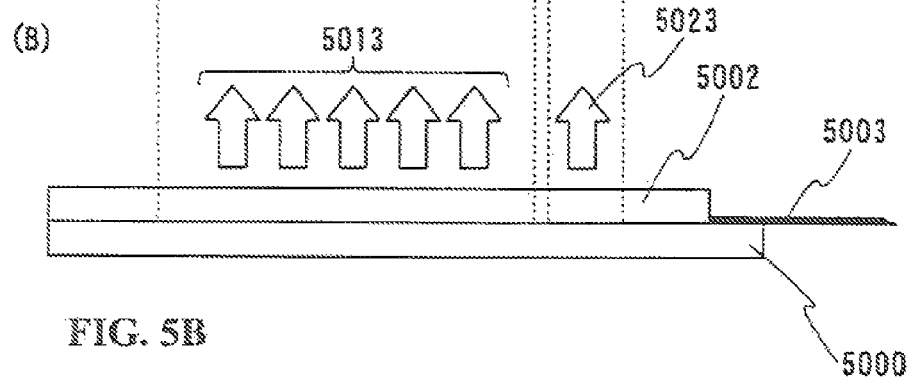

FIG. 5(A) is a top view of a panel substrate in which a substrate 5000 is set to the lower side whereas an opposing substrate 5002 is set to the upper side. Note that, the cross sectional view of one pixel in the first pixel portion of the panel substrate is illustrated in FIG. 1(A), and the cross sectional view of one pixel in the second pixel portion of the panel substrate is illustrated in FIG. 1(B). FIG. 5(B) is a side view seen from the lateral side of the panel substrate. Same portions as those in FIGS. 5(A) and 5(B) are denoted by the same reference numerals for the sake of omitting additional descriptions. A first pixel portion 5010 is formed on the substrate 5000, and a second pixel portion 5020 is formed at a position different from the first pixel portion 5010 on the substrate 5000. The first pixel portion 5010 includes a plurality of first pixels as depicted in FIG. 1(A) on a top surface of the substrate 5000. The plurality of first pixels is arranged in matrix. The plurality of first pixels constituting the first pixel portion has a plurality of first light emitting elements that emits light in a direction of the top surface of the substrate 5000. The first pixel portion 5010 emits light in a direction depicted by arrows of a light emitting direction 5013. The second pixel portion 5020 has a plurality of second pixels as illustrated in FIG. 1(B) on the top surface of the substrate 5000. The plurality of second pixels constituting the second pixel portion has a plurality of second light emitting elements that emits light in the direction of the top surface of the substrate 5000. The second pixel portion 5020 emits light in a direction depicted by an arrow of a light emitting direction 5023.

The second pixel portion 5020 is formed by overlapping with a first source line driving circuit 5011 for supplying signals which are necessary for making the first pixel portion 5010 emits light in the direction denoted by the light emitting direction 5023. An interlayer insulating film is interposed between the first source line driving circuit 5011 and the second pixel portion 5020 such that the first source line driving circuit 5011 is not electrically connected to the second pixel portion.

The surface of the substrate 5000 is sealed with a sealing material 5001 containing a filler and an opposing substrate 5002 other than a region on which an FPC (flexible printed circuit) 5003 is adhered thereto.

the first source line driving circuit 5011 and the first gate line driving circuits 5012a, 5012b are connected to the first pixel portion 5010 so as to supply signals that are necessary for making the first pixel portion 5010 emit light.

The second pixel portion 5020 is connected to the second driving circuit 5021 in order to supply signals that are necessary for making the second pixel portion 5020 emit light.

the panel substrate is supplied with a voltage and electric current, which are required for driving the first source line driving circuit 5011, the second driving circuit 5021, and the first gate line driving circuit 5012a, 5012b, via the FPC 5003.

If the device does not take such a structure that the first pixel portion 5010 and the second pixel portion 5020 are simultaneously turned on, it may take a structure as follows: wiring liens, which supply signals and voltage to the source line driving circuit 5011 for supplying signals required for operating the first pixel portion 5010 and the second driving circuit 5021 for supplying signals required for operating the second pixel portion 5020, are partly or entirely shared; and a means for operating any one of the first pixel portion and the second pixel portion is additionally provided such that the first and second pixel portions are externally switched. In this specification, the wiring lines for supplying signals to the driving circuits are referred to as signal lines, whereas the wiring liens for supplying a voltage to the driving circuits are referred to as power supply lines.

FIG. 6 shows an example in which the panel substrate as illustrated in FIG. 5 is applied to an electronic equipment, more specifically, the panel substrate is applied to a folding-type cellular phone.

The folding-type cellular phone illustrated in FIG. 6 is formed of a first housing 5100 and a second housing 5200. FIG. 6(A) shows a state when the folding-type cellular phone is opened. FIG. 6(B) shows a state when the folding-type cellular phone is folded up. FIG. 6(C) shows a cross sectional view of the folding-type cellular phone that is opened. The same portions as those in FIGS. 6(A) to 6(C) are denoted by the same reference numerals. Further, in FIGS. 6(A) to 6(C), the same portions as those in FIG. 5 are denoted by the same reference numerals.

The first housing 5100 comprises a speaker 5101, a display controller 5102, and the panel substrate according to the present invention that is illustrated in FIGS. 5(A) and 5(B). The panel substrate is constituted by bonding the substrate 5000 and the opposing substrate 5002 with a sealing material. The panel substrate further comprises the first pixel portion 5010 and the second pixel portion 5020.

The second housing 5200 has an antenna 5201, a microphone 5202, a module for driving a main body 5203, an operation key module 5204, and a battery 5205.

FIG. 6(A) shows the state in which the folding-type cellular phone is opened to its full size. Users can see images displayed on the first pixel portion 5020 and images displayed on the second pixel portion 5020, respectively.

FIG. 6(B) shows the state in which the folding-type cellular phone is folded up.

FIG. 6(C) shows the cross sectional view showing the state of opening the folding-type cellular phone, in which reference numeral 5013 denotes the light emitting direction of the first pixel portion 5010 and reference numeral 5023 denotes the light emitting direction of the second pixel portion 5020.

The present embodiment shows an example in which the light emitting direction 5013 of the first pixel portion 5010 and the light emitting direction 5023 of the second pixel portion 5020 are identical to each other. However, any one of the light emitting direction 5013 of the first pixel portion 5010 and the light emitting direction 5023 of the second pixel portion 5020 is inverted such that any one of the images displayed on the first pixel portion and the images displayed on the second pixel portion can be displayed on the reverse side of the first housing 5100 while displaying another images on the top side of the first housing 5100. In this case, users can see any one of the images displayed on the backside of the first housing 5100 while the folding-type cellular phone is folded up as depicted in FIG. 6(B). In order to display any one of the images displayed on the first pixel portion and the images displayed on the second pixel portion on the backside of the first housing 5100 by making the light emitting direction of the first pixel portion and the light emitting direction of the second pixel portion opposite to each other, for instance, the panel substrate with the first pixel portion and the second pixel portion as depicted in FIG. 2 formed thereon may be applied to the panel substrate as depicted in FIG. 5.

When a panel substrate on which the first pixel portion and the second pixel portion as depicted in FIG. 3 are formed is employed for the panel substrate as depicted in FIG. 5, a color display can be realized.

In addition, Embodiment 1 only shows an example of utilizing the light emitting device according to the present invention to the folding-type cellular phone. In addition, the light emitting device according to the present invention can also be applied to the other portable information terminals such as cellular phones having other constitutions, wireless radios, and personal digital assistances (PDAs).

What is claimed is:

1. A light emitting display device comprising:
   a first pixel portion including a plurality of first pixels arranged in matrix over a surface of a substrate; and
   a second pixel portion comprising a plurality of second pixels arranged at a position different from the first pixel portion over the surface of the substrate,
   wherein the first pixel portion comprises the plurality of first pixels comprising first light emitting elements which emit light to a side of the surface of the substrate,
   wherein the second pixel portion is formed over an interlayer film formed over a peripheral circuit portion, and the second pixel portion comprises the plurality of second pixels comprising second light emitting elements which emit light to the side of the surface of the substrate,
   wherein each of the second light emitting elements comprises:
   a pixel electrode provided over the interlayer film;
   a bank comprising an insulating material and provided over an edge of the pixel electrode;
   a light emitting layer provided over the pixel electrode through an opening portion of the bank; and
   a counter electrode provided over the light emitting layer, and
   wherein the bank is provided over the peripheral circuit portion and the interlayer film.

2. A light emitting display device comprising:
   a first pixel portion comprising a plurality of first pixels arranged in matrix over a surface of a substrate; and
   a second pixel portion including a plurality of second pixels arranged at a position different from the first pixel portion over the surface of the substrate,
   wherein the first pixel portion comprises the plurality of first pixels comprising first light emitting elements which emit light to a side opposite to the surface of the substrate,
   wherein the second pixel portion is formed over an interlayer film formed over a peripheral circuit portion, and the second pixel portion comprises the plurality of second pixels having second light emitting elements which emit light to a side of the surface of the substrate,
   wherein each of the second light emitting elements comprises:
   a pixel electrode provided over the interlayer film;
   a bank comprising an insulating material and provided over an edge of the pixel electrode;
   a light emitting layer provided over the pixel electrode through an opening portion of the bank; and
   a counter electrode provided over the light emitting layer, and wherein the bank is provided over the peripheral circuit portion and the interlayer film.

3. The light emitting display device according to claim 1, wherein the peripheral circuit portion comprises:
a first driving portion for operating the first pixel portion;
a second driving portion for operating the second pixel portion;
a plurality of wiring lines for supplying signals and a voltage to the first driving portion and the second driving portion, each of the wiring lines are partly or entirely shared; and
a means for operating any one of the first pixel portion and the second pixel portion.

4. The light emitting display device according to claim 2, wherein the peripheral circuit portion comprises:
a first driving portion for operating the first pixel portion;
a second driving portion for operating the second pixel portion;
a plurality of wiring lines for supplying signals and a voltage to the first driving portion and the second driving portion, each of the wiring lines are partly or entirely shared; and
a means for operating any one of the first pixel portion and the second pixel portion.

5. An electronic equipment comprising the light emitting display device according to claim 1.

6. An electronic equipment comprising the light emitting display device according to claim 2.

7. The light emitting display device according to claim 1 wherein the light emitting display device is incorporated into one selected from the group consisting of a cellular phone, a wireless radio and a personal digital assistance.

8. The light emitting display device according to claim 2 wherein the light emitting display device is incorporated into one selected from the group consisting of a cellular phone, a wireless radio and a personal digital assistance.

9. The light emitting display device according to claim 1 wherein the first light emitting elements comprise electroluminescence elements.

10. The light emitting display device according to claim 2 wherein the first light emitting elements comprise electroluminescence elements.

11. The light emitting display device according to claim 1 wherein the second light emitting elements comprise electroluminescence elements.

12. The light emitting display device according to claim 2 wherein the second light emitting elements comprise electroluminescence elements.

13. The light emitting display device according to claim 1 wherein the first light emitting elements comprise a material selected from the group consisting of a low-molecular-weight material, a high-molecular-weight material and an intermediate-molecular-weight material.

14. The light emitting display device according to claim 2 wherein the first light emitting elements comprise a material selected from the group consisting of a low-molecular-weight material, a high-molecular-weight material and an intermediate-molecular-weight material.

15. The light emitting display device according to claim 3 wherein the second pixel portion overlaps with a TFT group of the first driving portion.

16. The light emitting display device according to claim 4 wherein the second pixel portion overlaps with a TFT group of the first driving portion.

17. The light emitting display device according to claim 1 wherein the peripheral circuit portion comprises a driving portion for operating the first pixel portion.

18. The light emitting display device according to claim 2 wherein the peripheral circuit portion comprises a driving portion for operating the first pixel portion.

* * * * *

UNITED STATES PATENT AND TRADEMARK OFFICE
CERTIFICATE OF CORRECTION

PATENT NO.         : 7,808,457 B2                                                   Page 1 of 1
APPLICATION NO.    : 11/672074
DATED              : October 5, 2010
INVENTOR(S)        : Tomoyuki Iwabuchi It is certified that error appears in the above-identified patent and that said Letters Patent is hereby corrected as shown below:

Column 6, line 57, change "form" to --from--;
Column 7, line 23, change "2003" to --2023--; and
Column 11, line 42, change "5020" to --5010--.

Signed and Sealed this
Thirtieth Day of October, 2012

David J. Kappos
*Director of the United States Patent and Trademark Office*